United States Patent
Xu et al.

(10) Patent No.: US 10,129,042 B2
(45) Date of Patent: Nov. 13, 2018

(54) MBMS ERROR PROCESSING METHOD, COMMUNICATION NODE, COMMUNICATION SYSTEM, AND STORAGE MEDIUM

(71) Applicant: ZTE Corporation, Shenzhen, Guangdong (CN)

(72) Inventors: Hui Xu, Shenzhen (CN); Zijiang Ma, Shenzhen (CN)

(73) Assignee: XI'AN ZHONGXING NEW SOFTWARE CO. LTD., Xi'An (CN)

( * ) Notice: Subject to any disclaimer, the term of this patent is extended or adjusted under 35 U.S.C. 154(b) by 127 days.

(21) Appl. No.: 15/127,589

(22) PCT Filed: Jul. 10, 2014

(86) PCT No.: PCT/CN2014/081946
§ 371 (c)(1),
(2) Date: Sep. 20, 2016

(87) PCT Pub. No.: WO2015/143795
PCT Pub. Date: Oct. 1, 2015

(65) Prior Publication Data
US 2017/0180145 A1   Jun. 22, 2017

(30) Foreign Application Priority Data

Mar. 24, 2014   (CN) .......................... 2014 1 0112665

(51) Int. Cl.
*H04L 12/18* (2006.01)
*H04W 4/06* (2009.01)
(Continued)

(52) U.S. Cl.
CPC .......... *H04L 12/1868* (2013.01); *G01R 31/08* (2013.01); *G06F 11/0742* (2013.01);
(Continued)

(58) Field of Classification Search
CPC ............. H04L 12/1868; H04L 12/1863; H04L 2012/6467; H04W 76/32; H04W 76/18;
(Continued)

(56) References Cited

U.S. PATENT DOCUMENTS

2008/0107018 A1   5/2008 Zhang
2009/0196213 A1   8/2009 Zhong
(Continued)

FOREIGN PATENT DOCUMENTS

| CN | 101163260 A | 4/2008 |
|---|---|---|
| CN | 101222370 A | 7/2008 |
| WO | 2008052339 A1 | 5/2008 |

OTHER PUBLICATIONS

Supplementary European Search Report in European application No. 14887181.7, dated Feb. 16, 2017, 8 pgs.
International Search Report in international application No. PCT/CN2014/081946, dated Jan. 4, 2015, 5 pgs.
(Continued)

*Primary Examiner* — Charles Appiah
*Assistant Examiner* — Margaret G Mastrodonato
(74) *Attorney, Agent, or Firm* — Cooper Legal Group, LLC

(57) ABSTRACT

The present invention relates to the field of communications. Disclosed are an MBMS error processing method, a communications node, and a communications system, which are designed for solving the problem in the prior art that data cannot be transmitted in time when an MBMS error occurs. The method comprises: receiving indication information of an MBMS error; establishing a unicast bearer according to the indication information; and sending data through the unicast bearer, the data being data that a user equipment is receiving through an MBMS bearer or data that the user equipment is interested in to receive when the MBMS error occurs. Also disclosed is a computer storage medium.

18 Claims, 4 Drawing Sheets

(51) Int. Cl.
  *H04W 76/32* (2018.01)
  *G01R 31/08* (2006.01)
  *G06F 11/07* (2006.01)
  *G06F 11/30* (2006.01)
  *H04L 12/64* (2006.01)
  *H04H 20/71* (2008.01)

(52) U.S. Cl.
  CPC ......... *G06F 11/3013* (2013.01); *H04H 20/71* (2013.01); *H04L 12/1895* (2013.01); *H04W 4/06* (2013.01); *H04W 76/32* (2018.02); *H04L 12/1863* (2013.01); *H04L 2012/6467* (2013.01)

(58) Field of Classification Search
  CPC ...... H04W 4/06; H04H 20/71; G06F 11/0742; G06F 11/3013; G01R 31/08
  See application file for complete search history.

(56) References Cited

U.S. PATENT DOCUMENTS

| | | | |
|---|---|---|---|
| 2012/0099419 A1 | 4/2012 | Heung | |
| 2013/0121133 A1 | 5/2013 | Anchan et al. | |
| 2013/0242716 A1* | 9/2013 | Amerga | H04W 76/18 370/216 |
| 2016/0374050 A1* | 12/2016 | Prasad | H04W 4/06 |

OTHER PUBLICATIONS

English Translation of the Written Opinion of the International Search Authority in international application No. PCT/CN2014/081946, dated Jan. 4, 2015, 15 pgs.

* cited by examiner

MBMS ERROR PROCESSING METHOD, COMMUNICATION NODE, COMMUNICATION SYSTEM, AND STORAGE MEDIUM

TECHNICAL FIELD

The disclosure relates to a technology for processing an error in the field of communication, and in particular to a method, a communication node, a communication system and a storage medium for processing a Multimedia Broadcast Multicast Service (MBMS) error.

BACKGROUND

Along with rapid development of the Internet and popularization of large-screen multifunctional mobile phones, a great deal of mobile data multimedia services and various high-bandwidth multimedia services emerge, such as the mobile data multimedia services of video conferencing, television broadcasting, video on demand, advertising, online education, interactive games and the like. On one hand, increasing service requirements of mobile users are met. On the other hand, new service increasing points are also brought to mobile operators. These mobile data multimedia services require that the same data can be received by a plurality of users simultaneously, and have the characteristics of large data volume, long duration, sensitivity to time delay and the like compared with ordinary data services.

In order to effectively utilize mobile network resources, the 3rd Generation Partnership Project (3GPP) raises an MBMS, which is a technology through which data is transmitted from a data source to a plurality of targets, such that resources on the network (including a core network and an access network) are shared and a utilization rate of the network resources (particularly, air interface resources) is increased. The MBMS defined by the 3GPP can implement multicast and broadcast of pure-text and low-rate message and can also implement broadcast and multicast of high-speed multimedia service and provide various videos, audios and multimedia services, which undoubtedly complies with the tendency of development of mobile data in the future and provides a better service prospect for development of 3G.

In Long Term Evolution (LTE), an MBMS may be sent in a multicast mode, called a Multicast/Broadcast over Single Frequency Network (MBSFN) sending mode. The MBMS service sent in the multicast mode is also called an MBSFN service in which a plurality of cells may adopt the same modulation and coding scheme and send the same content by adopting the same physical resource.

Multi-cell transmission of the MBMS has the following characteristics:

1) the MBMS is synchronously transmitted in an MBSFN area;

2) multi-cell MBMS transmission combination is supported;

3) a Multicast Traffic Channel (MTCH) and a Multicast Control Channel (MCCH) are mapped to a Multicast Channel (MCH) in a Point-to-Multipoint (p-T-m) mode; and 4) an MBSFN synchronization area, the MBSFN area, MBSFN transmission, advertisement and a preservation cell are all semi-statically configured through operation and maintenance.

In such a manner, User Equipment (UE) of a plurality of cells may receive a plurality of pieces of MBMS data with the same contents and perform SFN combination, thereby increasing a gain of received signals. A plurality of cells which send the same MBMS by adopting the same physical resource in the MBSFN sending mode form an MBSFN area.

During practical LTE networking, a plurality of MBSFN services exist in an MBSFN area, and all of these MBSFN services belonging to the same MBSFN area form an MBSFN service group. That is, an MBSFN service group belongs to only one MBSFN area. An MBSFN area includes a plurality of cells, and identical MBSFN service groups are configured for the respective cells. Data channels MTCHs with a plurality of MBSFN services of the same MBSFN area and a control channel MCCH of the MBSFN services may be multiplexed onto an MCH. An MCCH and a plurality of MTCHs (i.e. a plurality of logical channels) of the same MBSFN area may be mapped to the same transmission channel MCH; and the MCH operates as a bearer through a Transport Block (TB) of an MBSFN subframe.

In an existing public technology, an MCH Subframe Allocation Pattern (MSAP) occasion is simultaneously introduced into the concept of MSAP, and it indicates all multicast resources contained in an MCH corresponding a certain MSAP within a time period of a dynamic scheduling period. In an MSAP occasion, a plurality of MTCHs and dynamic scheduling information may be sent, and an MCCH may also be used, in which the dynamic scheduling information is born in a Control Element (CE) of a Media Access Control (MAC) Protocol Data Unit (PDU), wherein a time length of the MSAP occasion may be 320 ms. The time length of an MSAP occasion is a scheduling period, and is also called a dynamic scheduling period. One or more MBSFN subframes of one or more MBSFN frames are allocated to an MCH allocates through an MSAP, in which a subframe sent in a multicast mode is called an MBSFN subframe, and a frame containing an MBSFN subframe is called an MBSFN frame.

On each MSAP occasion configured in an MCH, dynamic scheduling information is born, mapping information from MTCHs to auxiliary MSAP subframes is contained. The mapping information is determined by using the relationship between the No. and index of an MBSFN subframe in a scheduling period. UE may read the scheduling information to know allocation of each MTCH on the MBSFN subframes, and the UE can read MTCH of interest from the corresponding MBSFN subframe and neglect the MBSFN subframes not required to be read, so that the efficiency in which MBMS is received by the UE is improved, and power consumption of the UE is reduced. Herein, Nos. of MBSFN subframe are determined by sequentially arranging and numbering all MBSFN subframes allocated by an MCH within a scheduling period.

In an existing LTE technology, an MCH is multiplexed by a plurality of logical channels in a manner as follows: a subframe corresponds to a Transmission Time Interval (TTI), a TB may be sent in a TTI and each data TB corresponds to a MAC PDU. A MAC PDU may contain a plurality of MAC Service Data Units (SDUs) which may be from different logical channels including for example an MTCH, an MCCH and the like. Data from different logical channels is connected in series in the MAC PDUs and then sent together over a physical channel.

A clustering communication system is a dedicated wireless communication system developed to meet commanding and scheduling requirements of the users of the industry and oriented to a specific industrial application, in which there are numerous wireless users sharing a small number of wireless channels and which takes commanding and scheduling as main applications, and is a multipurpose and high-efficiency wireless communication system. A clustering communication system is widely applied to the fields of government departments, public safety, emergency communication, power, civil aviation, petrochemical engineering, military and the like. In 3GPP LTE, clustering communication is called Group Communication Service Enabling (GCSE). At present, a probability that clustering communication is implemented by adopting an MBMS technology is under discussion in the industry.

In a process of researching and practicing a conventional art, it is found that the conventional art has a problem as follows:

in case of a network error, how to timely send a clustering service born by an MBMS to UE to avoid a incapability of sending data or an significant delay occurring when the data is sent is a problem urgent to be solved by the conventional art.

SUMMARY

In view of this, the embodiments of the disclosure are expected to provide a method, a communication node, a communication system and a storage medium for processing an MBMS error, so as to timely ensure that data can be sent smoothly, reduce delay occurring when the data is sent and increase the degree of satisfaction of a user in case of an MBMS error.

In order to achieve the purpose, the technical solutions of the embodiments of the disclosure are implemented as follows.

In a first aspect of the embodiments of the disclosure, there is provided a method for processing an MBMS error, which may include that:

indication information of the MBMS error is received;

a unicast bearer is established according to the indication information; and data is sent through the unicast bearer, wherein the data includes received data which is being received by User Equipment (UE) through an MBMS bearer or data of interest which the UE is interested in when the MBMS error occurs.

Alternatively, the step that the indication information of the MBMS error is received may include that:

the indication information of the MBMS error is received from the UE or a Broadcast-Multicast Service Centre (BM-SC).

Alternatively, the MBMS error may be a network equipment fault which makes it impossible to normally send the MBMS data within a specified time.

In a second aspect of the embodiments of the disclosure, there is provided a method for processing an MBMS error, which may include that:

an error indicator of the MBMS error of network equipment is acquired;

indication information is formed according to the error indicator; and the indication information is sent to an Application Server (AS), wherein the AS establishes a unicast bearer and sends data by using the unicast bearer according to the indication information.

Alternatively, the step that the error indicator of the MBMS error of the network equipment is acquired may include:

the error indicator is extracted from MBMS Scheduling Information (MSI) or Radio Resource Control (RRC) signalling sent by an Evolved Node B (eNB).

Alternatively, the step that the error indicator of the MBMS error of the network equipment is acquired may include:

when the MSI, or an MSI numerical value for indicating the MBMS error is not received within a specified time, it is determined that the MBMS error has occurred in the network equipment and it is deemed automatically that the error indicator has been acquired.

Alternatively, the network equipment may be the eNB, a Multicell/Multicast Coordination Entity (MCE), a Mobility Management Entity (MME), an MBMS-GateWay (MBMS-GW) or a BM-SC.

Alternatively, the step that the error indicator of the MBMS error of the network equipment is acquired may include:

UE acquires the error indicator of the MBMS error of the network equipment from the MSI or RRC signalling sent by the eNB.

Alternatively, the step that the indication information is sent to the AS may include:

the UE sends the indication information to the AS through application layer signalling of a GC1 interface.

Alternatively, the step that the error indicator of the MBMS error of the network equipment is acquired may include:

the BM-SC acquires own MBMS error to form the error indicator; or the BM-SC receives the error indicator of the MBMS error.

Alternatively, the step that the indication information is sent to the AS may include:

the BM-SC sends the indication information to the AS through a GC2 interface.

Alternatively, the MBMS error may be a network equipment fault which makes it impossible to normally send the MBMS data within a specified time.

In a third aspect of the embodiments of the disclosure, there is provided a method for processing an MBMS error, which may include that:

an indication information sending node acquires an error indicator of the MBMS error of network equipment;

the indication information sending node forms indication information according to the error indicator;

the indication information sending node sends the indication information to an AS;

the AS receives the indication information of the MBMS error;

the AS establishes a unicast bearer according to the indication information; and the AS sends data through the unicast bearer, wherein the data includes received data which is being received by UE through an MBMS bearer or data of interest which the UE is interested in when the MBMS error occurs.

Alternatively, the indication information sending node may be the UE or a BM-SC.

Alternatively, the step that the indication information sending node acquires the error indicator of the MBMS error of the network equipment may include:

the UE extracts the error indicator from MSI or RRC signalling sent by an eNB;

the BM-SC acquires own MBMS error to form the error indicator; or the BM-SC receives the error indicator of the MBMS error.

Alternatively, the step that the indication information sending node acquires the error indicator of the MBMS error of the network equipment may include that:

when the MSI, or an MSI numerical value for indicating the error is not received within a specified time, the UE determines that the MBMS error has occurred in the network equipment and deems automatically that the error indicator has been acquired.

In a fourth aspect of the embodiments of the disclosure, there is provided a communication node, which may be an AS, the AS including:

a first receiving unit configured to receive indication information of the MBMS error;

an establishment unit configured to establish a unicast bearer according to the indication information; and a first sending unit configured to send data through the unicast bearer, wherein the data includes received data which is being received by UE through an MBMS bearer or data of interest which the UE is interested in when the MBMS error occurs.

Alternatively, the first receiving unit may be configured to receive the indication information of the MBMS error from the UE or a BM-SC.

In a fifth aspect of the embodiments of the disclosure, there is provided a communication node, which may include:

an acquisition unit configured to acquire an error indicator of the MBMS error of network equipment;

a forming unit configured to form indication information according to the error indicator; and a second sending unit configured to send the indication information to an AS, wherein the AS establishes a unicast bearer and sends data by using the unicast bearer according to the indication information.

Alternatively, the acquisition unit may be configured to extract the error indicator from MSI or RRC signalling sent by an eNB.

Alternatively, the communication node may be UE; and the acquisition unit may be configured to, when the MSI, or an MSI numerical value for indicating the MBMS error is not received within a specified time, determine that the MBMS error has occurred in the network equipment and deem automatically that the error indicator has been acquired.

Alternatively, the network equipment may be the eNB, an MCE, an MME, an MBMS-GW or a BM-SC.

Alternatively, the communication node may be the UE; and the acquisition unit may be configured to acquire the error indicator of the MBMS error of the network equipment through the eNB.

Alternatively, the second sending unit may be configured to send the indication information to the AS through application layer signalling of a GC1 interface.

Alternatively, the communication node may be the BM-SC; and the acquisition unit may be configured to acquire own MBMS error of the BM-SC to form the error indicator, or receive the error indicator of the MBMS error.

Alternatively, the second sending unit may be configured to send the indication information to the AS through a GC2 interface.

In a sixth aspect of the embodiments of the disclosure, there is provided a communication system, which may include:

an indication information sending node configured to acquire an error indicator of the MBMS error of network equipment, form indication information according to the error indicator and send the indication information to an AS;

the AS configured to receive the indication information of the MBMS error, establish a unicast bearer according to the indication information and send data through the unicast bearer, wherein the data includes received data which is being received by UE through an MBMS bearer or data of interest which the UE is interested in when the MBMS error occurs.

Alternatively, the indication information sending node may be the UE or a BM-SC.

Alternatively, the UE may be configured to extract the error indicator from MSI or RRC signalling sent by an eNB; or the BM-SC may be configured to acquire own MBMS error to form the error indicator; or the BM-SC may be configured to receive the error indicator of the MBMS error.

Alternatively, the UE may be configured to, when the MSI, or an MSI numerical value for indicating the error is not received within a specified time, determine that the MBMS error has occurred in the network equipment and deem automatically that the error indicator has been acquired.

In a seventh aspect of the embodiment of the disclosure, there is provided a computer storage medium having stored therein computer-executable instructions for executing at least one of the methods according to the first to third aspects of the embodiments of the disclosure.

According to the method, communication node, communication system and storage medium for processing an MBMS error of the embodiments of the disclosure, the indication information is formed when the MBMS error or fault occurs; the indication information is sent to the AS; and the AS timely establishes the unicast bearer according to the indication information to send the data which is being received by UE through an MBMS bearer or data of interest which the UE is interested in, through the unicast bearer, instead of the MBMS bearer. Thus, the problem that the data may not be sent normally or timely when the MBMS error occurs is solved, the data sent by a sender may timely arrive at a receiver, and the degree of satisfaction of the user is increased.

DETAILED DESCRIPTION

Preferred embodiments of the disclosure will be described in detail below with reference to the appending drawings, and it should be understood that the preferred embodiments described below are only adopted to describe and explain the disclosure and not intended to limit the disclosure.

Embodiment 1

Figure 1:
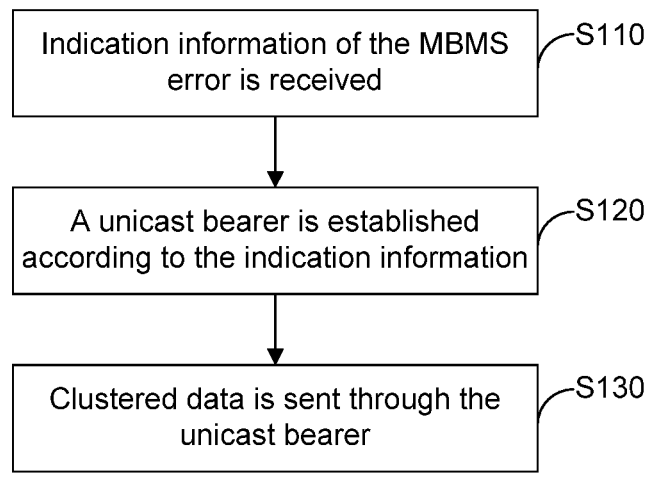
FIG. 1 is a schematic flowchart of a method for processing an MBMS error according to an embodiment 1 of the disclosure.

As shown in FIG. 1, the present embodiment provides a method for processing an MBMS error, which includes the following steps.

In Step 110, indication information of the MBMS error is received.

In Step 120, a unicast bearer is established according to the indication information.

In Step 130, data is sent through the unicast bearer.

The data includes received data which is being received by UE through an MBMS bearer or data of interest which the UE is interested in when the MBMS error occurs.

The MBMS error in Step 110 may be a network equipment fault which makes it impossible to normally send the MBMS data within a specified time. Specifically, the network equipment faults including damage in a circuit board, damage in an interface, failure in a link, congestion in a link and the like in terms of the network equipment may all make it impossible to normally send the MBMS data, and may all cause the MBMS error. In a specific implementation process, the MBMS error usually does not include the condition that all network nodes of a communication network fault. When faults occur in all the network nodes, information cannot be sent among the network nodes, so that the indication information of the MBMS error cannot be sent. In addition, an error which can be automatically recovered within an indicated time is not needed to be included in the MBMS error, in which case, multicast can also be established, the MBMS data may still be smoothly sent after the network error is recovered, and a delay occurring when data is sent is short.

In Step 120, when the indication information is received by the AS, it is indicated that the MBMS data cannot be generated at present due to a network fault or error. The network fault or error which makes it impossible to transmit the MBMS data may also be called an MBMS error. In order to ensure that the data is transmitted timely, the unicast bearer with the UE is established. Compared with an MBMS bearer through which a sender sends the same data to a plurality of receivers at the same time, the unicast bearer is a data bearer mode in which a sender sends data to only one receiver at a time. The AS is equipment which sends application layer signalling and/or data to the UE through the unicast bearer or the MBMS bearer.

The step of sending the data through the unicast bearer instead of the MBMS bearer in step 130 may at least include sending the received data which is being received by the UE or the data of interest which the UE is interested in when the MBMS error occurs. The data may specifically include clustered data. The data which the UE is interested in receiving may specifically include data which is received by the UE through the MBMS bearer before the time when the MBMS error occurs.

In the present embodiment, the network equipment is each piece of equipment which provides network service for the UE in a network, specifically including an eNB, an MCE, an MME, an MBMS-GW, a BM-SC and the like.

The eNB represents a base station in 3GPP LTE and LTE-Advanced (LTE-A) systems, and corresponds to UE of a user, the eNB is a bridge between UE in LTE (4G) and an Evolved Packet Core (EPC), and the eNBs are connected via an X2 interface.

The MCE is access network equipment, is abbreviated from Multicell/Multicast Coordination Entity, and configures a radio resource for an MBMS.

The MME is a node on a control plane of a 3GPP LTE core network, and is responsible for processes of positioning, paging, attachment, position updating and the like of UE.

The MBMS-GW is an MBMS gateway, and is responsible for transmission of MBMS signalling and data of a core network.

In the present embodiment, the indication information is sent, the unicast bearer is established and the data is sent through the unicast bearer instead of the MBMS bearer, so that the data may be timely sent to destination UE in case of the MBMS fault or error of the network to solve the problem of incapability of sending data or long delay occurring when data is sent, and the degree of satisfaction of a user is further increased.

Alternatively, Step 110 may include that:

the indication information of the MBMS error is received from the UE or the BM-SC.

In the existing structure of the network, UE is directly connected with an AS via a GC1 interface, and a BM-SC is directly connected with the AS via a GC2 interface. Thus, when a fault or error occurs in any piece of equipment of the network, the indication information can be forwarded to the UE or the BM-SC at first and then sent to the AS through the UE or the BM-SC. The BM-SC is configured to realize functions such as establishment, modification, releasing and the like of an MBMS bearer.

In a specific implementation process, the AS is also directly connected with another network node. When there is fault in the network equipment, the indication information can also be sent to the AS through the other network node, specifically such as a Serving/Public Data Network-Gate-Way (S/P-GW) which is a user plane gateway.

By the abovementioned improvement, a specific solution in which the indication information is sent to an application gateway is provided, the method for processing an MBMS error is further detailed, the problem of incapability of sending data or excessively long delay occurring when data is sent is solved, and the advantage of convenience for implementation is also achieved.

Embodiment 2

Figure 2:
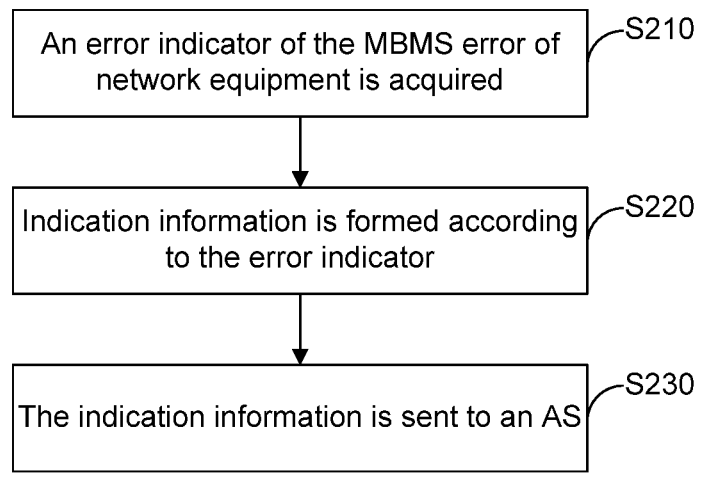
FIG. 2 is a schematic flowchart of a method for processing an MBMS error according to an embodiment 2 of the disclosure.

As shown in FIG. 2, the present embodiment provides a method for processing an MBMS error, which includes the following steps.

In Step 210, an error indicator of the MBMS error of network equipment is acquired.

In Step 220, indication information is formed according to the error indicator.

In Step 230, the indication information is sent to an AS.

The AS establishes a unicast bearer and sends data by using the unicast bearer according to the indication information.

In the present embodiment, an execution subject for performing Steps 210-230 may be a communication node, such as UE or a BM-SC, capable of directly sending the data to the AS.

In Step 220, the indication information is formed according to the error indicator. The indication information may specifically be a bitmap which an indication code for indicating a network fault or error. Alternatively, a plurality of forms such as text information may specifically be adopted for the indication information without further limitation.

In Step 230, the network error or fault in form of indication information is timely reported to the AS, such that the AS can timely send the data through the unicast bearer instead of the MBMS bearer, though which the data was intended to be sent, according to the indication information, so as to solve the problem of incapability of sending data and long delay occurring when data is sent.

Specifically, Step 210 is implemented as follows:
the error indicator is extracted from MSI or RRC signalling sent by an eNB.

In a specific implementation process, the MSI is an MSI MAC control unit, and is identified through a MAC PDU header containing a Logical Channel Identifier (LCID).

Each MAC control unit has a variable length of 2x bytes, wherein x is the number of elements in an MBMS-Session Info List sequence. For each MTCH, the following fields are included:

LCID: LCID is a field which indicates an LCID of the MTCH, and usually has a length of 5 bits; and Stop MTCH: Stop MTCH is a field which indicates a sequence number of a corresponding MTCH end subframe in an MSAP occasion, and usually has a length of 11 bits. A specific Stop MTCH value of 2047 indicates that the corresponding MTCH is not scheduled, and Stop MTCH values of 2043 and 2046 are preserved values. Therefore, the error indicator may be born by at least one of 2043 to 2046, and a structure of Stop MTCH may be as shown in Table 1. Index represents a bit index, and Content Type represents a content type. And a Stop MTCH value is used to specifically indicate a sub-frame position where the data is born.

TABLE 1

| Index | Content Type |
|---|---|
| 0-2042 | Stop MTCH |
| 2043 or 2046 | Network error |
| 2047 | The MTCH is not scheduled |

Therefore, in the present embodiment, the error indicator may be born by a newly added value of the MSI or the preserved value 2043 or 2046 for indicating whether a fault occurs in the current network equipment such that the error that the MBMS data cannot be transmitted or not is caused.

In addition, the RRC protocol signalling may be existing RRC signalling, and may also be newly added RRC signalling specifically for transmitting the error indicator. The existing RRC signalling may include an MCCH, a System Information Block (SIB) or RRC Connection Reconfiguration. The error indicator is formed by adding a message into the existing RRC signalling or coupling the existing RRC signal and other information. The error indicator is used to notify a communication node, such as UE, which is capable of directly establishing a communication link with the AS, that the MBMS error occurs at present.

According to the present embodiment, the error indicator is extracted from the MSI or the RRC signalling, so that compatibility with the conventional art may be well achieved, and convenience and rapidness for implementation are ensured.

Specifically, Step 210 may also be implemented as follows:
when the MSI, or an MSI numerical value for indicating the MBMS error is not received within a specified time, it is determined that an MBMS error occurs in the network equipment and it is deemed automatically that the error indicator has been acquired.

In an MBMS communication process, the MSI may be transmitted between communication nodes to ensure normal communication, and the MSI is usually born in a radio frame for periodic transmission. In the embodiment, when an MBMS error occurs in certain network equipment, the MSI will not be transmitted, then UE which does not receive the MSI deems automatically that the MBMS error occurs in the network, and Steps 220 and 230 are further performed.

Instead of acquiring the error indicator by using contents transmitted through the MSI and the RRC signalling, in the present embodiment, it is determined whether the MBMS error occurs or not according to whether the MSI is transmitted or not, which also has the advantage of convenience for implementation.

Alternatively, the network equipment is an eNB, an MCE, an MME, an MBMS-GW or a BM-SC.

Alternatively, the step that the error indicator of the MBMS error of the network equipment is acquired is implemented as follows:

UE directly or indirectly acquires the error indicator of the MBMS error from the network equipment through the eNB.

A wireless connection may be established between the UE and the eNB, a wired or wireless connection may also be established between the eNB and other network equipment, and a direct connection may be established between the UE and the AS. Therefore, when an MBMS error occurs in the eNB or the other network equipment, an error indicator may be directly sent to the UE by the eNB, or forwarded to the eNB by the other network equipment at first and then forwarded to the UE by the eNB, and finally sent to the AS by the UE. The UE may directly communicate with the AS via a GC1 interface, so that Step 230 may be implemented as follows:

the UE sends the indication information to the AS through application layer signalling of a GC1 interface.

In a specific implementation process, some network equipment may establish direct connections with the AS, so that the network equipment may also directly send the indication information to the AS, or the network equipment may function as an intermediate node such as the BM-SC which receives the error indicator from the other network equipment, forms the indication information and sends the same to the AS.

Therefore, Step 210 may also be implemented as follows:
the BM-SC acquires own MBMS error to form the error indicator; or the BM-SC receives the error indicator of the MBMS error from other network equipment. The other network equipment is multicast network equipment, such as the eNB, the MCE, the MME or the MBMS-GW, except the BM-SC. When the network equipment receiving the error indicator is the BM-SC, Step 230 may be implemented as follows: the BM-SC sends the indication information to the AS via a GC2 interface.

Utilizing the UE or the BM-SC to acquire the error indicator to form the indication information and send the indication information to the AS has the advantage of convenience for implementation.

As described above, according to the method for processing an MBMS error provided by the embodiment, in case of the error of MBMS transmission incapability caused by the network faults, the indication information is sent to the AS to notify the AS to timely transfer the data of the MBMS bearer onto the unicast bearer for avoiding the phenomenon that the data cannot be timely transmitted, such that the degree of satisfaction of a user is increased.

Embodiment 3

The embodiment provides a method for processing an MBMS error, which includes the following steps.

In Step 310, an indication information sending node acquires an error indicator of the MBMS error of network equipment.

In Step 320, the indication information sending node forms indication information according to the error indicator.

In Step 330, the indication information sending node sends the indication information to an AS.

In Step 340, the AS receives the indication information of the MBMS error.

In Step 350, the AS establishes a unicast bearer according to the indication information.

In Step 360, the AS sends data through the unicast bearer.

The data is received data which is being received by UE through an MBMS or data of interest which the UE is interested in when the MBMS error occurs.

The embodiment is a combination of the embodiment 1 and the embodiment 2. When the error indicator of the MBMS error of the network is acquired in Step 310, if the indication information sending node and the network equipment with the MBMS error are the same communication node, specifically, for example, if both the indication information sending node and the network equipment with the MBMS error are the same BM-SC, the indication information is formed according to own MBMS error.

Alternatively, the indication information sending node may be a communication node, such as the UE or the BM-SC, which is capable of directly communicating with the AS.

When the indication information sending node is the UE, Step 310 may include that:

the UE extracts the error indicator from MSI or RRC signalling sent by an eNB.

The UE is directly connected with the eNB. When an MBMS error occurs in the eNB, an error indicator may be directly sent to the UE. When an MBMS error occurs in other network equipment, except the eNB, which is not directly connected with the UE, an error indicator may be sent to the eNB at first and then sent to the UE. Moreover, the error indicator may usually be born in the MSI or the RRC signalling, so that the UE extracts the error indicator from the MSI or the RRC signalling in Step 310.

Alternatively, Step 310 may further include that: when the MSI, or an MSI numerical value for indicating the MBMS error is not received within a specified time, the UE determines that the MBMS error has occurred in the network equipment and deems automatically that the error indicator has been acquired. The MSI numerical value may be a Stop MTCH value for indicating the MBMS error as in the abovementioned embodiment, specifically such as at least one of 2043 and 2046.

The network equipment periodically sends the MSI to the UE when running normally, and thus the MBMS error caused by a network equipment fault may be notified to the UE by the fact that the MSI is not sent to the UE when the MBMS error occurs. When the MSI is not received within the specified time, the UE may directly deem that the error indicator is received and form the indication information.

When the indication information sending node is the BM-SC, Step 310 may include that:

the BM-SC acquires own MBMS error to form the error indicator; or the BM-SC receives the error indicator of the MBMS error.

The BM-SC directly or indirectly receives the error indicator from other network equipment such as the eNB, an MCE, an MME or an MBMS-GW. The error indicator may be sent through newly added signalling or a message, or incorporated into various existing signalling or messages for transmission, and a plurality of implementation manners may be adopted, and will not be elaborated one by one herein.

No matter which method is adopted to acquire the error indicator to form the indication information, the advantages of high compatibility with the conventional art and convenience for implementation are achieved.

As described above, according to the method for processing an MBMS error of the embodiment, the error indicator is acquired and the indication information is sent to the AS; and the AS establishes the unicast bearer with the UE on the basis of the indication information, and sends integrated data, which is originally determined to be born through the MBMS, by using the unicast bearer, so that the integrated data may be timely transmitted, and the degree of satisfaction of a user is increased.

Some specific examples will be provided below with reference to the embodiment 1 to the embodiment 3.

EXAMPLE 1

Figure 4:
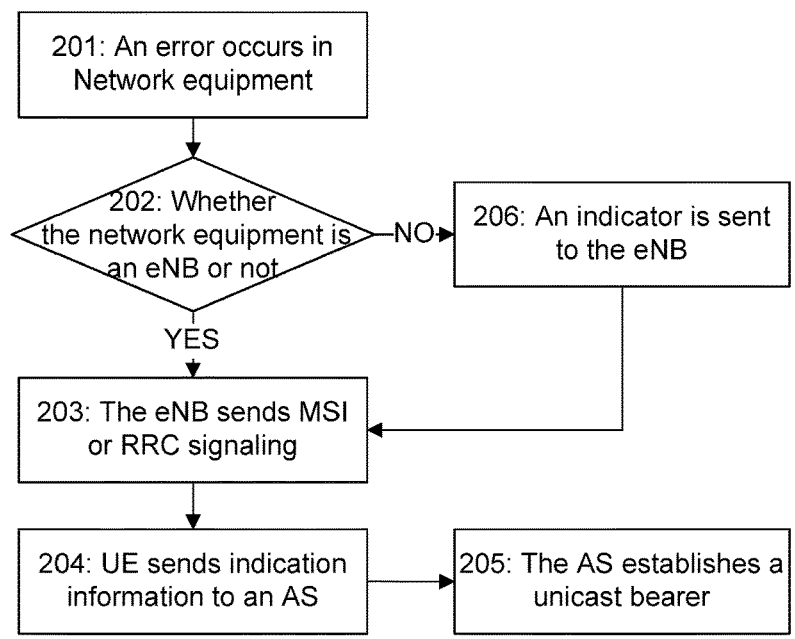
FIG. 4 is a schematic flowchart of a method for processing an MBMS error according to an example 1 of the disclosure.

A method for implementing clustering communication for a scenario where a network error is indicated by a special value in MSI, as shown in FIG. 4, includes the following steps.

In Step 201, an error occurs in network equipment which may include at least one of an eNB, an MCE, an MME, an MBMS-GW and a BM-SC. The error refers to an event which makes it impossible to send MBMS data normally, and does not include a fault, which may be automatically recovered, or failure of all network nodes. The error is also called an MBMS error.

In Step 202, whether the network equipment is the eNB or not is judged. If the network equipment is the eNB, the process proceeds to Step 203. If the network equipment is not the eNB, the process proceeds to Step 206.

If the network equipment is the eNB, the eNB directly sends indication information to UE, otherwise the indication information is sent to the eNB at first and then sent to the UE through the eNB. When the error does not occur in the eNB, the eNB is not triggered to generate and send the indication information to the UE, and thus network equipment, such as the network equipment with the error or management network equipment of the network equipment with the error, is required to send the indication information to the eNB at first. The indication information may specifically be MSI containing a special value, or RRC signalling.

Step 203: the eNB sends the MSI containing the special value or the RRC signalling to the UE. The special value of the MSI or the RRC signalling bears the indication information. The special value is Stop MTCH=2046 or 2043. The MSI is configured and sent to the eNB by the MCE. The RRC signalling is existing RRC signalling, such as an MCCH, an SIB and RRC Connection Reconfiguration, or newly added RRC signalling.

In Step 204, the UE sends the indication information to an AS. The UE sends the indication information to the AS through application layer signalling of a GC1 interface.

In Step 205, the AS establishes a unicast bearer with the UE.

If the AS determines to send the data through the unicast bearer according to the received error indication information, and then the AS establishes the unicast bearer between itself and the UE and sends the data.

In Step 206, the network equipment sends the indication information to the eNB, and the process proceeds to Step 203.

If the network equipment is not the eNB, the indication information of the MBMS error is sent to the eNB, specifically through an existing flow or a newly added flow.

EXAMPLE 2

Figure 5:
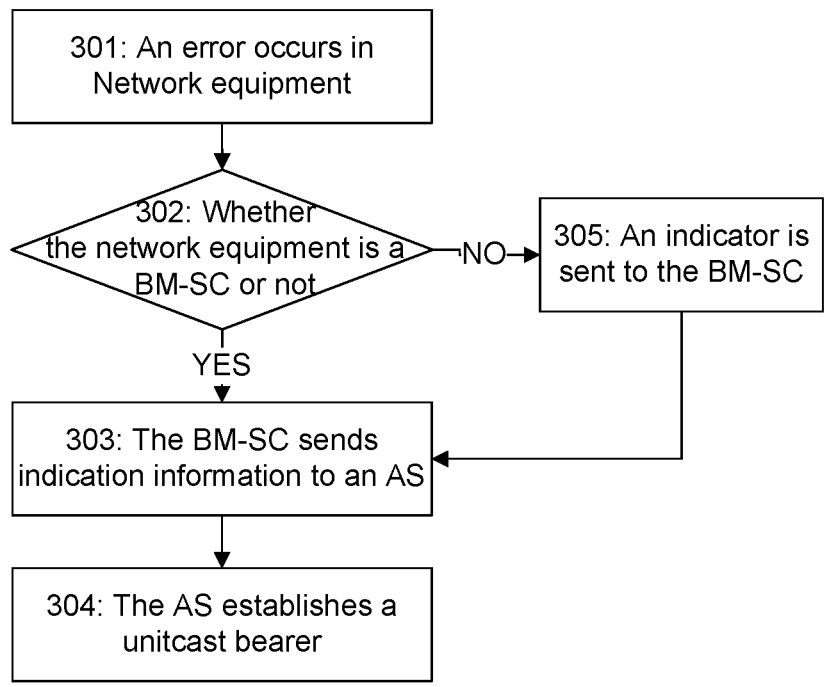
FIG. 5 is a schematic flowchart of a method for processing an MBMS error according to an example 2 of the disclosure.

A method for implementing clustering communication for a scenario where a network entity indicates a network error, as shown in FIG. 5, includes the following steps.

In Step 301, an error occurs in network equipment. The step is the same as Step 201, and will not be elaborated herein.

In Step 302, whether the network equipment is a BM-SC or not is judged, if the network equipment is BM-SC, the process proceeds to Step 303, if the network equipment is not BM-SC, the process proceeds to Step 305. The BM-SC directly sends indication information to an AS if the network equipment is the BM-SC, otherwise the indication information is sent to the BM-SC and then the indication information is sent to the AS through the BM-SC. When the error does not occur in the BM-SC, the BM-SC is not triggered to generate and send the indication information to the AS, and thus equipment such as the network equipment with the error or management network equipment of the network equipment with the error is required to send the indication information to the BM-SC at first.

In Step 303, the BM-SC sends the error indication information to the AS.

The BM-SC sends the error indication information to the AS via a GC2 interface.

In Step 304, the AS establishes a unicast bearer between itself and the UE for sending data.

If the AS determines to send the data through the unicast bearer according to the received error indication information, the AS establishes the unicast bearer between itself and the UE for sending the data.

In Step 305, the network equipment sends the indication information of the MBMS error to the BM-SC, and then the process proceeds to Step 303.

If the network equipment is not the BM-SC, the indication information of the MBMS error is sent to the BM-SC, and specifically for how the BM-SC sends the indication information to the AS, any one of the methods in the conventional art may be adopted.

Embodiment 4

Figure 6:
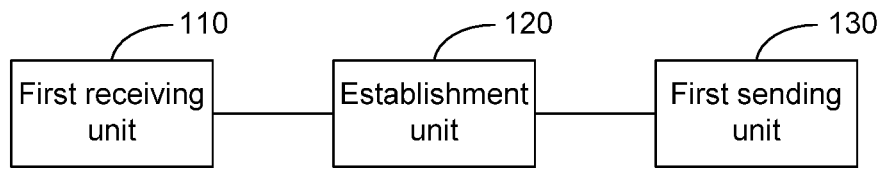
FIG. 6 is a schematic diagram of a structure of a communication node according to an embodiment 4 of the disclosure.

As shown in FIG. 6, the embodiment provides a communication node, which is an AS includes a first receiving unit 110, an establishment unit 120 and a first sending unit 130.

The first receiving unit 110 is configured to receive indication information of the MBMS error.

The establishment unit 120 is configured to establish a unicast bearer according to the indication information.

The first sending unit 130 is configured to send data through the unicast bearer.

The data is received data which is being received by UE through an MBMS or data of interest which the UE is interested in.

A specific structure of the first receiving unit 110 may include a communication interface with a receiving function. The communication interface may be a wired communication interface or a wireless communication interface, specifically such as a receiving antenna.

The establishment unit 120 may also include a communication interface for establishing a unicast bearer connection link between the AS and the UE.

A physical structure of the first sending unit 130 may also include a communication interface which may be a wired communication interface or a wireless communication interface, specifically such as a sending antenna.

Alternatively, the first receiving unit is configured to receive the indication information of the MBMS error from the UE or a BM-SC.

The communication node of the embodiment provides hardware support for the method for processing an MBMS error of the embodiment 1, may be configured to implement any technical solution in the embodiment 1, and also solves the problem of data transmission incapability when the MBMS error occurs and increases the degree of satisfaction of a user.

Embodiment 5

Figure 7:
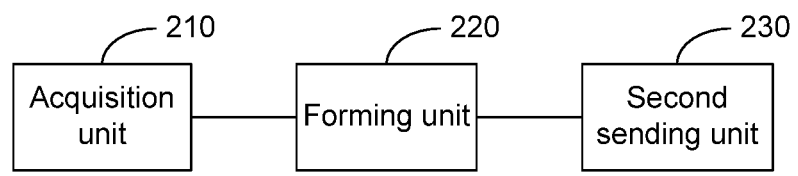
FIG. 7 is a schematic diagram of a structure of a communication node according to an embodiment 5 of the disclosure.

As shown in FIG. 7, the present embodiment provides a communication node, which includes an acquisition unit 210, a forming unit 220 and a second sending unit 230.

The acquisition unit 210 is configured to acquire an error indicator of the MBMS error of network equipment.

The forming unit 220 is configured to form indication information according to the error indicator.

The second sending unit 230 is configured to send the indication information to an AS.

The AS establishes a unicast bearer and sends data by using the unicast bearer according to the indication information.

In the present embodiment, the acquisition unit 210 may have different specific structures according to different error indicator acquisition conditions. When the acquisition unit 210 is configured to receive the error indicator from other equipment, a specific structure of the acquisition unit 210 may include a communication interface which may be a wired or wireless communication interface, specifically such as a receiving antenna. When the acquisition unit 210 forms the error indicator, the specific structure of the acquisition unit 210 may include a processor which may include a single-core or dual-core central processing unit, a digital signal processor, a single-chip microcomputer, a programmable logic array or the like.

A physical structure of the second sending unit 230 may also include a communication interface which may be a wired communication interface or a wireless communication interface, specifically such as a sending antenna.

As a further improvement of the embodiment, the acquisition unit 210 is configured to extract the error indicator from MSI or RRC signalling directly or indirectly sent by the network equipment. For details about how the error indicator is acquired from the MSI or the RRC signalling, please refer to the embodiment 2, and the details will not be further elaborated herein in detail.

The communication node is the UE. The acquisition unit 210 is configured to, when the MSI is not received within a specified time, determine that the MBMS error has occurred in the network equipment and deem automatically that the error indicator has been acquired. Under a normal condition, the UE acquires the MSI from a specified timeslot or specified subframe of each radio frame, and when the MBMS error occurs, i.e. a network is abnormity, sending of the MSI to the UE may be interrupted, and then the UE may determine whether the MBMS error has occurred in the network equipment or not according to whether the MSI is received or not. At this moment, the acquisition unit 210 includes a communication interface and a processor connected with the communication interface. When the communication interface does not receive the MSI within the specified time, the processor deems that the MBMS error has occurred in the network equipment, that is, acquisition of the error indicator is implemented.

Alternatively, the network equipment is an eNB, an MCE, an MME, an MBMS-GW or a BM-SC.

When the communication node is the UE, the acquisition unit 210 may further specifically be configured to acquire the error indicator of the MBMS error of the network equipment from the MSI or RRC signalling sent by the eNB. Therefore, a specific hardware structure of the acquisition unit 210 may be a receiving communication interface such as a receiving antenna.

When the communication node is the UE, the second sending unit 230 is configured to send the indication information to the AS through application layer signalling of a GC1 interface.

In addition, the communication node may also be the BM-SC. The acquisition unit 210 is configured to acquire own MBMS error of the BM-SC to form the error indicator, or receive the error indicator of the MBMS error from other network equipment. Alternatively, the second sending unit 230 is specifically configured to send the indication information to the AS via a GC2 interface.

The embodiment provides an internal structure of an indication information sending node, which is configured to send the indication information to the AS to notify the AS that the MBMS error occurs at present and it is necessary to establish the unicast bearer to send a clustered service, provides specific hardware support for the method for processing an MBMS error of the embodiment 2 and also has the advantage of high degree of satisfaction of a user.

Embodiment 6

The embodiment provides a communication system, which includes an indication information sending node and an AS.

The indication information sending node is configured to acquire an error indicator of the MBMS error of network equipment, form indication information according to the error indicator and send the indication information to an AS.

The AS is configured to receive the indication information of the MBMS error, establish a unicast bearer according to the indication information and send data through the unicast bearer.

The data is received data which is being received by UE through an MBMS or data of interest which the UE is interested in when the MBMS error occurs.

The present embodiment is configured to provide hardware support for the method for processing an MBMS error of the embodiment 3, may be configured to implement any of the technical solutions of the embodiment 1, also solves the problem that data cannot be sent normally when the MBMS error occurs and increases the degree of satisfaction of a user.

Alternatively, the indication information sending node is the UE or a BM-SC.

When the indication information sending node is the UE, the UE may be configured to extract the error indicator from MSI or RRC signalling sent by an eNB. The UE may further be configured to, when the MSI is not received within a specified time, determine that the MBMS error has occurred in the network equipment and deem automatically that the error indicator has been acquired.

Figure 8:
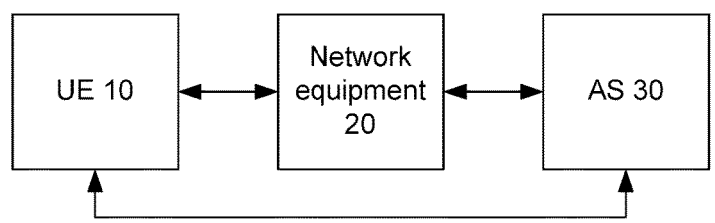
FIG. 8 is a first schematic diagram of a structure of a communication system according to an embodiment 6 of the disclosure.

FIG. 8 is an application example of the communication system of the present embodiment. The communication system includes UE 10, network equipment 20 and an AS 30. The UE 10 receives an error indicator sent by the network equipment 20, and the UE 10 forms indication information according to the error indicator, and sends the indication information to the AS 30.

In a specific implementation process, if the network equipment 20 with an MBMS error may establish a connection with the AS 30, the network equipment 20 may also directly send the indication information to the AS 30.

Figure 9:
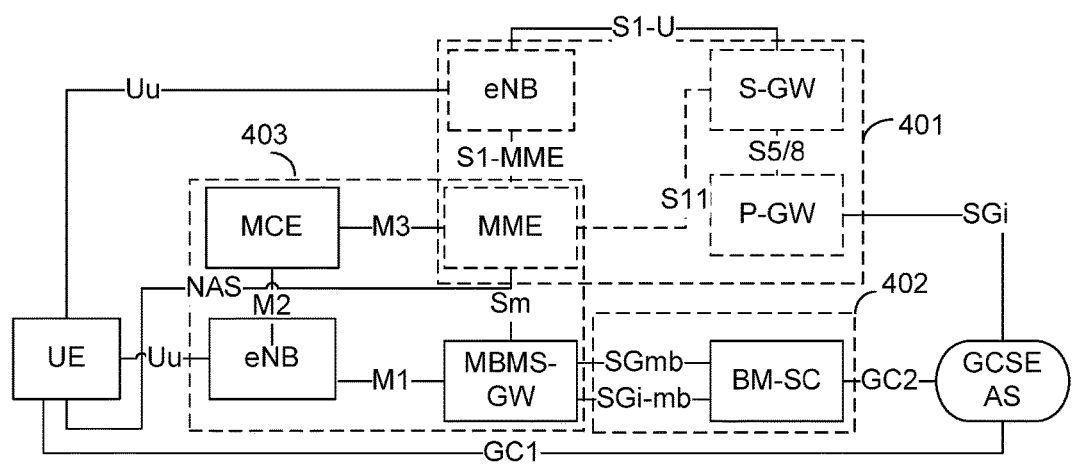
FIG. 9 is a second schematic diagram of a structure of a communication system according to the embodiment 6 of the disclosure.

FIG. 9 is another application example of the communication system of the present embodiment. The communication system includes UE, an AS (wherein, clustering communication in 3GPP LTE is called GCSE, and accordingly, the AS is also called a GSCE AS), an eNB, an MCE, an MME, an MBMS-GW, a BM-SC, an S-GW and a P-GW. Network equipment involved in the dashed box 401 may serve as unicast equipment, and network equipment in the dashed boxes 402 and 403 may serve as multicast equipment. Uu, M1, M2, M3, NAS, Sm, GC1, GC2, SGi, S1-MME, S1-U, S11, SGmb, SGI-mb and S5/8 are all communication interfaces. The UE is connected with the eNB through Uu. The eNB is connected with the MBMS-GW through M1. The eNB is connected with the MCE through M2. The MCE is connected with the MME through M3. The eNB is connected with the MME through S1-MME. The MME is connected with the MBMS-GW through Sm. The MBMS-GW is connected with the BM-SC through SGmb and SGi-mb. The BM-SC is connected with the GCSE AS through GC2. The GSCE AS is connected with the P-GW through SGi. The MME is connected with the S-GW through S11. The P-GW is connected with the S-GW through S5/8. The eNB is connected with the S-GW through S1-U.

From the above, according to the communication system of the present embodiment, the error indicator and the indication information are formed, so that the AS can timely make the data, which is originally determined to be born through an MBMS, to be born through a unicast bearer to solve the problem that the data cannot be timely transmitted in case of an MBMS fault and increase the degree of satisfaction of a user.

Figure 3:
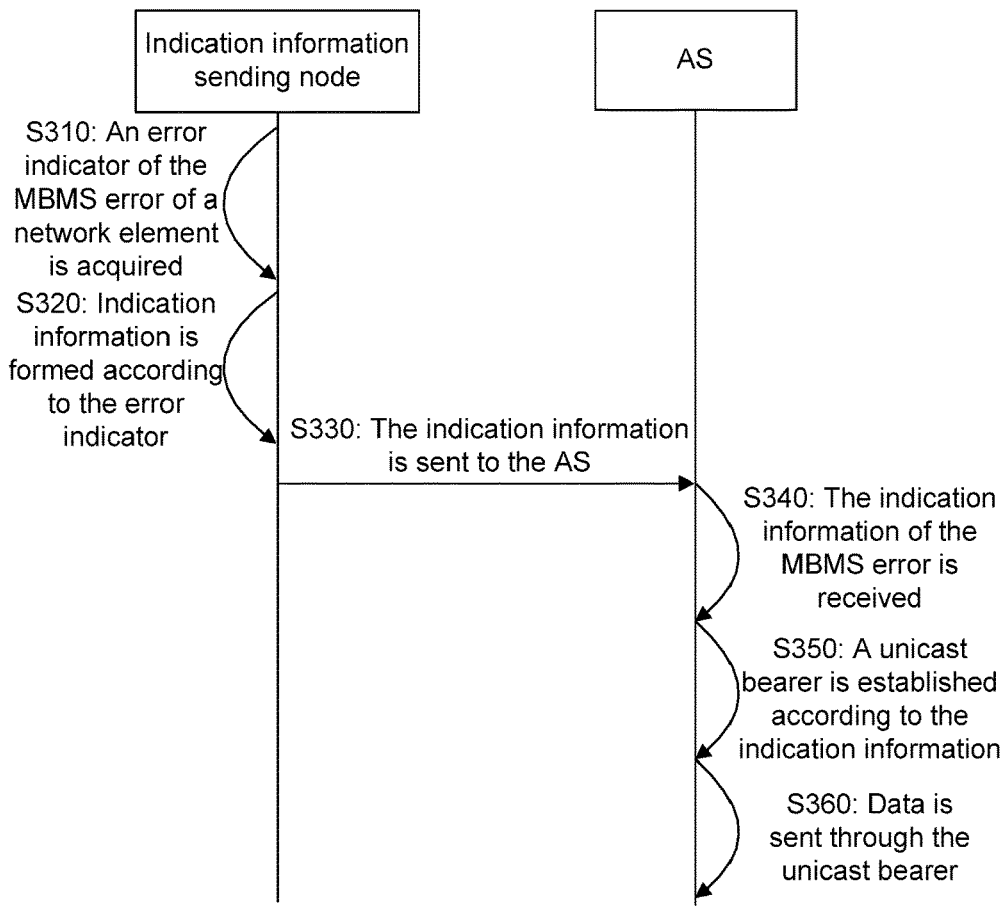
FIG. 3 is a schematic flowchart of a method for processing an MBMS error according to an embodiment 3 of the disclosure.

The embodiment of the disclosure further provides a computer storage medium having stored therein computer-executable instructions for executing the methods according to at least one of claims 1 to 15. Specifically, when the computer-executable instructions are executed, one or more of the methods shown in FIGS. 1, 2 and 3 can be implemented.

The storage medium may specifically be a storage medium, such as a magnetic tape, a Digital Video Disk (DVD), a compact disc, a portable hard drive or a USB flash disk, which is alternatively a non-transitory storage medium.

The above is only the preferred embodiment of the disclosure and not intended to limit the scope of protection of the disclosure. Any modifications made according to the principle of the disclosure shall fall within the scope of protection of the disclosure.

What is claimed is:

1. A method for processing a Multimedia Broadcast Multicast Service (MBMS) error, comprising:

receiving indication information of the MBMS error, wherein the indication information being formed according to an error indicator of the MBMS error of network equipment, and the error indicator being extracted from MBMS Scheduling Information (MSI) sent by an Evolved Node B (eNB);

establishing a unicast bearer according to the indication information; and sending data through the unicast bearer, wherein the data includes received data which is being received by User Equipment (UE) through an MBMS bearer or data of interest which the UE is interested in when the MBMS error occurs, and wherein the error indicator is born by a newly added value of the MSI or the preserved value 2043 or 2046.

2. The method according to claim 1, wherein receiving the indication information of the MBMS error comprises:

receiving the indication information of the MBMS error from the UE or a Broadcast-Multicast Service Centre (BM-SC).

3. The method according to claim 1, wherein the MBMS error is a network equipment fault which makes it impossible to normally send MBMS data within a specified time.

4. A method for processing a Multimedia Broadcast Multicast Service (MBMS) error, comprising:

acquiring an error indicator of the MBMS error of network equipment;

forming indication information according to the error indicator; and sending the indication information to an Application Server (AS), wherein the AS establishes a unicast bearer and sends data by using the unicast bearer according to the indication information, wherein acquiring the error indicator of the MBMS error of the network equipment comprises:

extracting the error indicator from MBMS Scheduling Information (MSI) sent by an Evolved Node B (eNB), and wherein the error indicator is born by a newly added value of the MSI or the preserved value 2043 or 2046.

5. The method according to claim 4, wherein acquiring the error indicator of the MBMS error of the network equipment comprises:

when the MSI, or an MSI numerical value for indicating the MBMS error is not received within a specified time, determining that the MBMS error has occurred in the network equipment and deeming automatically that the error indicator has been acquired.

6. The method according to claim 4, wherein the network equipment is the eNB, a Multicell/Multicast Coordination Entity (MCE), a Mobility Management Entity (MME), an MBMS-GateWay (MBMS-GW) or a Broadcast-Multicast Service Centre (BM-SC).

7. The method according to claim 6, wherein acquiring the error indicator of the MBMS error of the network equipment comprises:

acquiring, by User Equipment (UE), the error indicator of the MBMS error of the network equipment from the MSI or Radio Resource Control (RRC) signalling sent by the eNB.

8. The method according to claim 7, wherein sending the indication information to the AS comprises:

sending, by the UE, the indication information to the AS through application layer signalling of a GC1 interface.

9. The method according to claim 6, wherein acquiring the error indicator of the MBMS error of the network equipment comprises:

acquiring, by the BM-SC, own MBMS error to form the error indicator; or receiving, by the BM-SC, the error indicator of the MBMS error.

10. The method according to claim 9, wherein sending the indication information to the AS comprises:

sending, by the BM-SC, the indication information to the AS through a GC2 interface.

11. A communication node, the communication node comprising a processor and a communication interface, wherein the processor is configured to:

acquire an error indicator of a Multimedia Broadcast Multicast Service (MBMS) error of network equipment; and form indication information according to the error indicator, wherein the communication interface is configured to send the indication information to an Application Server (AS), wherein the AS establishes a unicast bearer and sends data by using the unicast bearer according to the indication information, wherein the processor is further configured to extract the error indicator from MBMS Scheduling Information (MSI) sent by an Evolved Node B (eNB), and wherein the error indicator is born by a newly added value of the MSI or the preserved value 2043 or 2046.

12. The communication node according to claim 11, wherein the communication node is User Equipment (UE), and wherein the processor is further configured to, when the MSI, or an MSI numerical value for indicating the MBMS error is not received within a specified time, determine that the MBMS error has occurred in the network equipment and deem automatically that the error indicator has been acquired.

13. The communication node according to claim 11, wherein the network equipment is the eNB, a Multicell/Multicast Coordination Entity (MCE), a Mobility Management Entity (MME), an MBMS-GateWay (MBMS-GW) or a Broadcast-Multicast Service Centre (BM-SC).

14. The communication node according to claim 13, wherein the communication node is the UE, and wherein the processor is further configured to acquire the error indicator of the MBMS error from the network equipment through the eNB.

15. The communication node according to claim 14, wherein the communication interface is further configured to send the indication information to the AS through application layer signalling of a GC1 interface.

16. The communication node according to claim 13, wherein the communication node is the BM-SC, wherein the processor is further configured to acquire own MBMS error of the BM-SC to form the error indicator, or receive the error indicator of the MBMS error, and wherein the communication interface is further configured to send the indication information to the AS through a GC2 interface.

17. A non-transitory computer storage medium having stored therein computer-executable instructions for executing the method according to claim 1.

18. A non-transitory computer storage medium having stored therein computer-executable instructions for executing the method according to claim 4.

* * * * *